United States Patent [19]
Cusinato et al.

[11] Patent Number: 5,864,258
[45] Date of Patent: Jan. 26, 1999

[54] VCO COMPOSED OF PLURAL RING OSCILLATORS AND PHASE LOCK LOOP INCORPORATING THE VCO

[75] Inventors: Paolo Cusinato, Sestri Levante; Melchiorre Bruccoleri, Genoa, both of Italy

[73] Assignee: SGS-Thomson Microelectronics S.r.l., Agrate Brianza, Italy

[21] Appl. No.: 846,873

[22] Filed: May 1, 1997

[30] Foreign Application Priority Data

May 2, 1996 [EP] European Pat. Off. .............. 96830255

[51] Int. Cl.$^6$ .............................. H03B 5/04; H03K 3/354; H03L 7/099
[52] U.S. Cl. ................................. 331/34; 331/47; 331/48; 331/52; 331/56; 331/57; 331/177 R
[58] Field of Search .................................. 331/46, 47, 48, 331/50, 52, 56, 57, 34, 177 R

[56] References Cited

U.S. PATENT DOCUMENTS

| | | | |
|---|---|---|---|
| 4,105,950 | 8/1978 | Dingwall | 331/57 |
| 5,357,217 | 10/1994 | Marchesi et al. | 331/57 |
| 5,463,353 | 10/1995 | Countryman et al. | 331/57 |

OTHER PUBLICATIONS

Enam et al., IEEE Journal of Solid–State Circuits, "A 300–MHz CMOS Voltage–Controlled Ring Oscillator", vol. 25, No. 1, (Feb. 1, 1990), pp. 312–315.

Alvarez et al., IEEE Journal of Solid–State Circuits, "A Wide–Bandwidth Low–Voltage PLL for Power PCTM Microprocessors", vol. 30, No. 4, (Apr. 1, 1995), pp. 383–390.

*Primary Examiner*—Siegfried H. Grimm
*Attorney, Agent, or Firm*—Allen, Dyer, Doppelt, Milbrath & Gilchrist, P.A.

[57] ABSTRACT

A voltage-controlled oscillator, with high noise rejection of the supply voltage, includes a plurality of delay cells in an odd number $N \geq 3$, which are connected to form a first ring oscillator and powered by the difference between a supply voltage Vcc and a variable regulating voltage VR. The VCO comprises at least one second ring oscillator formed by a plurality of delay cells in an odd number $M \geq 3$, at least one of which is also a delay cell of the first oscillator and at least two of which do not belong to the first oscillator. At least one of these two cells is powered by a constant voltage (Vcc), in such a manner that the two oscillators operate at the same frequency and the interaction between the two oscillators introduces a high-frequency negative feedback which has the effect of effectively reducing the noise of the supply voltage Vcc.

18 Claims, 5 Drawing Sheets

VCO COMPOSED OF PLURAL RING OSCILLATORS AND PHASE LOCK LOOP INCORPORATING THE VCO

FIELD OF THE INVENTION

The present invention relates to a voltage-controlled oscillator, which is preferably constructed in integrated technology using CMOS devices (complementary metal oxide semiconductor devices), and to a phase lock circuit incorporating this oscillator, which exhibits low jitter and high noise rejection from the supply voltage.

BACKGROUND OF THE INVENTION

It is known that phase lock circuits or PLL (an acronym for Phase Lock Loop), are being increasingly used for the generation of high-frequency clock signals for electronic apparatuses, especially electronic processors and transmission systems, by means of comparison with a periodic reference signal which is generally of lower frequency. In the field of magnetic recording and of telecommunications, PLL circuits furthermore permit the recognition of the fundamental frequency of a signal which is modulated (in phase or frequency) and the generation of an unmodulated signal which has the same frequency and which serves as a basis for the discrimination and the recognition of the modulation impressed on the comparison signal.

In phase lock circuits, an element which is critical for the purposes of achieving the desired benefits of a very short lock time and of uniformity of the clock signal generated (i.e. of low jitter) is constituted by the voltage-controlled oscillator (which is known by the acronym VCO). In the embodiment which is most common, on account of the possibility of construction in integrated circuit form, a VCO consists of an odd number N of inversion logic elements, or delay cells, which elements are ring-connected in such a manner as to generate a square wave with a period equal to $2 N \cdot \Delta$ where $\Delta$ is the propagation delay of each cell. The variable delay of each cell is controlled by the supply voltage of the cells, which is constituted by the difference between a constant supply voltage Vcc and a variable regulating voltage.

On account of its structure, this type of VCO is influenced by the variations of the supply voltage which, in the absence of appropriate measures, modify the operating frequency of the oscillator to the same extent as variations of the regulating voltage. If the variations of the supply voltage are very slow with a transient duration greater than the time constant of the phase lock circuit in which the oscillator is connected, the PLL is able to intervene, modifying the control voltage, in such a manner that the frequency of the oscillator does not vary. This can be done with the introduction of a temporary and negligible phase variation between the reference signal and the feedback signal generated by the oscillator (possibly frequency-divided). If, however, the voltage variation is very abrupt, the oscillator modifies the output frequency, which, in the course of a plurality of signal cycles, results in an unacceptable dephasing or skew between the reference signal on the input side at the PLL, and the output signal from the oscillator.

Normally, the skew is expressed as a time delay relative to the reference signal, that is to say with a time unit of measurement (for example nsec).

The skew may also be expressed as a phase delay relative to the reference signal, that is to say in radians or as a percentage of the period of the reference signal. As the voltage variations may have opposite signs and thus give rise to angular shifts in the sense of a lead or a delay, the maximum algebraic difference of the skews in the sense of a lead or a delay which are caused by the voltage variations is defined as jitter.

To limit this disadvantage (skew and jitter) it is typically necessary to introduce measures which permit the rejection of the noise from the supply voltage of the VCO. The noise rejection is conventionally expressed as the ratio between the skew caused by an unexpected variation of the supply voltage and the amplitude of the voltage variation. This is accordingly measured in sec/V or, if expressed as a phase delay in relation to the reference signal, in radians/V or the percentage of the period %/V. The rejection is therefore higher, the smaller the numerical value which expresses it.

The solutions proposed by the prior art for the purpose of achieving a noise rejection are essentially of three types:

A) A dedicated supply for the VCO, which supply is inherently free from noise. Unfortunately, this approach is costly and does not lend itself to the construction of PLLs which are integrated with other circuits in a single electronic component, such as, for example, a microprocessor.

B) Construction of VCOs with delay stages having a differential structure. This approach permits the attainment of high noise rejection from the supply voltage, at the expense of a high degree of circuit complexity.

C) Construction of VCOs with high-frequency negative feedback.

By way of example, in this last approach, a capacitive coupling between the terminal at voltage Vcc and the terminal at the regulating voltage VR permits the transfer to some extent of the noise of the voltage Vcc to the regulating terminal, and, thus, to the regulating voltage. However, the output impedance of this terminal, which is not negligible, limits this effect.

Another way of implementing a high-frequency negative feedback includes using the output signal of the VCO to periodically charge and discharge a capacitor with the frequency of the output signal of the VCO. The mean value of the charging voltage of which, which is a function of the frequency of the output signal of the VCO, and is added to the regulation voltage VR.

Recently, as described in the publication: IEEE JOURNAL OF SOLID STATE CIRCUITS, Vol. 30 No. 4, APR 1995, in the article by Jose Alvarez et al. entitled "A wide-bandwidth Low-voltage PLL for Power PC™ Microprocessor", pages 383–391, it was proposed, for the purpose of achieving a high noise rejection from the supply voltage, to construct the VCO with a pair of ring oscillators identical to one another and both being voltage-controlled and mutually synchronous by a cross-coupling of the output delay cells of the two rings, in such a manner that the two oscillators operate in phase opposition.

The output signals from the two ring oscillators, which are mutually dephased by 180°, are applied on the input side to a differential stage which restores the full excursion of the output signal from the supply voltage Vcc to earth. Even though no explanation is given in the cited document, it is deduced from an analytical study of the circuit that the noise rejection is due to the cross-synchronization of the two rings which, as explained further on, forces the synchronization cells to operate with a propagation and synchronization delay. This delay is approximately constant or which increases as the supply voltage Vcc−VR of the cells increases, that is to say in the sense opposite to that in which the delay of the other cells varies.

Furthermore, during the synchronization time interval, the conflict between signals applied on the input side to the synchronization cells causes an increase in load on the reference voltage generator and a corresponding variation of the mean value of the regulation voltage VR. This accordingly introduces a high-frequency negative feedback with a modest gain which, nevertheless, cannot be increased without causing an unacceptable reduction of the voltage/frequency conversion gain of the oscillator circuit.

SUMMARY OF THE INVENTION

This limitation described in the foregoing background is overcome, with the possibility of obtaining a more effective negative feedback with high loop gain, by the voltage-controlled oscillator forming the subject of the present invention. The VCO comprises at least one first ring oscillator, comprising an odd number of delay cells which are voltage-controlled by a voltage generator with resistance drop, and a second ring oscillator which may be defined as a negative-feedback oscillator. The latter also being formed by an odd number of delay cells (not necessarily equal to that of the first ring). In addition, at least one of which is also a cell of the first ring, while at least two of the other cells are cells which do not belong to the first ring, and at least one of which is supplied with constant voltage to introduce a relatively constant delay in the period of oscillation of the second ring and a pulsed overloading of the regulating-voltage generator. The overloading amount is related to the variations of the supply voltage Vcc, and is due to the interference between the two oscillators which are necessarily forced to oscillate at the same frequency. Preferably, but not necessarily, all the cells of the negative feedback oscillator, except the one which is in common with the first ring oscillator, are not voltage-controlled but are supplied with fixed voltage.

In a preferred embodiment, the voltage-controlled oscillator comprises a first and a second ring oscillator, which are identical to one another, each formed by five voltage-controlled delay cells, and by a third ring oscillator which is cross-coupled with the first and second ones to synchronize the first and second oscillator with one another with a predetermined dephasing different from 180° C. Each one of the ring sections which form the cross-coupling between the first and the second oscillator preferably comprises at least one delay cell supplied with a fixed voltage.

The voltage-controlled oscillator of the type indicated—in contrast to that described in the Alvarez et al. article—introduces a high-frequency negative feedback, the magnitude of which is correlated to the cumulative skew, due to the noise in the supply voltage, of the signal transitions of all the delay cells upstream of the negative-feedback cell. The VCO of the invention has a much higher negative feedback gain and without substantial attenuation of the gain of the transfer function of the oscillator.

Furthermore, in the particular preferred construction mentioned above, the negative-feedback intervals are distributed in a more uniform manner and are in a greater number within the period of oscillation. Accordingly, the instantaneous phase error of the controlled oscillator is reduced to a minimum, as is the "ripple" (high-frequency fluctuation) of the regulating voltage. The oscillator of the present invention which is used in a phase-lock circuit permits the attainment of noise rejection below 1.2%/V. This can be further increased (even 0.5%/V) by using a power supply which is separate or; however, filtered, only for the negative-feedback oscillator or synchronization ring which is cross-coupled.

BRIEF DESCRIPTION OF THE DRAWINGS

The features and the advantages of the present invention will become clearer from the description which follows, which is made with reference to the accompanying drawings, in which.

DETAILED DESCRIPTION OF THE PREFERRED EMBODIMENTS

Figure 1:
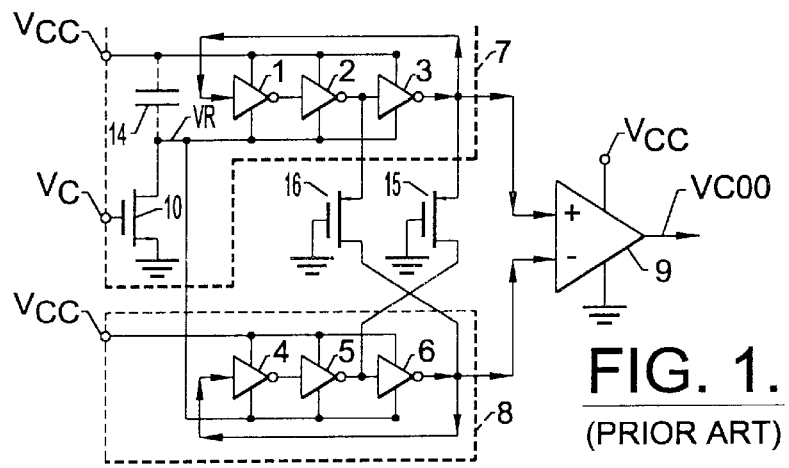
FIG. 1 represents, in a block circuit diagram, a VCO with high-frequency negative feedback according to the known prior art.

To facilitate an understanding of the invention, it is useful to refer to FIG. 1, which represents, in block-diagram form, the prior art described in the cited document. FIG. 1 represents a VCO which is essentially provided by two conventional ring oscillators 7, 8 which are cross-coupled to one another, and by a differential output stage 9. The oscillator 7 is formed by three (in general, an odd number N≧3) inverting delay cells 1, 2, 3 which are ring-connected (that is to say the output of the cells 1, 2, 3 is connected to the input of the cells 2, 3, 1 respectively).

The cells are powered by a voltage Vcc–VR, the voltage Vcc, for example +5 V relative to earth, being supplied by a power supply system (not illustrated) which also powers other electronic circuits. The voltage VR, which is positive relative to earth, is applied by a variable voltage generator, such as a regulating transistor 10, for example, an N-channel MOS transistor with its source terminal connected to earth and its gate connected to a variable control voltage Vc. The regulating transistor 10 behaves as a variable resistor, the value of which varies inversely with the control voltage Vc (at least for a predetermined excursion range of Vc). The regulating transistor 10 is connected in series between the voltage Vcc and earth and to a load constituted by the cells 1, 2, 3 (and by the cells of the ring oscillator 8).

The voltage VR is thus a function not only of Vc but also of the voltage Vcc and of the load impedance constituted by the cells 1, 2, 3 (and by the cells of the oscillator 8). As we shall see, by varying the load impedance it is possible to impose on VR, independently of Vc, variations which to some extent compensate the variations of the supply voltage Vcc–VR of the cells which are due to the noise of the voltage Vcc. It should be noted that, rather than including a regulating transistor 10 which is unique for all the cells, the generator of the regulating voltage VR may include a plurality of regulating transistors, one for each delay cell or for groups of cells.

Figure 2:
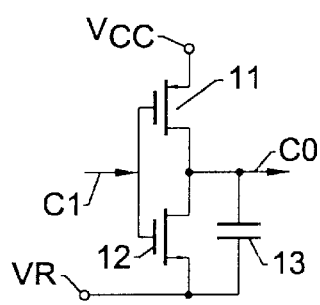
FIG. 2 represents the basic electrical diagram of a VCO delay cell which is constructed using CMOS technology according to the known prior art.

FIG. 2 shows a typical inverting delay cell structure constructed in CMOS technology, in its simplest embodiment. The cell comprises a P-channel MOS transistor 11 and an N-channel MOS transistor 12, with common drains, which are powered in series by the voltage Vcc–VR applied between the source electrode of the MOS transistor 11 and the source electrode of the MOS transistor 12.

A capacitor 13 connected between the drain electrodes, which provide the output CO of the cell and the source electrode of the MOS transistor 12, represents the parasitic capacitances of the device and a possible output capacitance introduced within the device to increase the propagation time thereof. The gates of the MOS transistors 11, 12, which are connected to one another, provide the control input CI of the cell. As is well known, the two transistors behave as variable resistors, the resistance of which varies in inverse proportion (to a first approximation) to the voltage Vgs applied between gate and source. Thus, when the voltage applied to the gates is equal to VR, the transistor 12 exhibits a virtually infinite resistance and the transistor 11 a predetermined resistance R11 which is relatively low, but not zero, and inversely proportional to Vcc–VR.

When the voltage applied to the gates is equal to Vcc, the transistor 12 exhibits a predetermined resistance R12, which, for the sake of simplicity, may be considered to be equal to R11, while the resistance of the transistor 11 is virtually infinite. Thus, the delay cell behaves as an RC network which is alternately short-circuited or powered by the voltage Vcc–VR, with a time constant T equal to RC (where R=R11=R12 and C is the value of the capacitance C) and the propagation delay $\Delta$=0.7 T.

The propagation delay is the time required to enable the output to assume a switching level which is approximately equal to 50% of the supply voltage Vcc–VR. As R is inversely proportional to Vcc–VR, the propagation time is inversely proportional to Vcc–VR and, to a first approximation, for the reason stated above, to Vc as well.

If we now consider only the cells 1, 2, 3, these elements constitute a conventional ring oscillator, with propagation delay $3\Delta$, period $6\Delta$ and frequency $1/6\Delta$ proportional to Vcc–VR. The oscillator is frequency-controlled by means of the voltage Vcc–VR, and can be seen as a functional unit which converts the control voltage Vc, and thus VR, into an output frequency f where f=Ko·Vc or alternatively f=Kr·(Vcc–VR). The transfer function Ko (Kr if related to Vcc–VR), or gain of the unit, may be, on an indicative basis, on the order of 100 MHz/V. It is, nevertheless, evident that a variation $\Delta$Vcc of the supply voltage Vcc is reflected in a frequency variation $\Delta$f=Kr·$\Delta$Vcc which is equal to the same frequency variation caused by a variation $\Delta$VR of equal amplitude.

The noise rejection of the supply voltage Vcc is therefore null. The negative feedback which is inherently implemented by the current taken up by the oscillator, which constitutes the charging current of the generator of the regulating voltage VR and which varies in proportion to the frequency (being on average Im=C·(Vcc–VR)/$\Delta$ as may readily be verified) is reflected in a reduction in the gain, not in an effective discrimination between variations of Vcc and variations of VR.

To attenuate these variations which are undesired as they are due to Vcc and not to the regulating voltage VR, and thus to Vc, it is possible to connect a capacitor 14 between Vcc and the drain of the MOS transistor 10, a measure which is in fact used but which is of limited effectiveness. In fact, the capacitor 14 in series with the (variable) resistance of the MOS transistor 10 forms, between the power supply Vcc and the load constituted by the oscillator, a low-pass RC network, the cutoff frequency of which cannot be less than a certain limit, so as not to limit the frequency response to the control signal Vc and on account of the intrinsic difficulty of incorporating a high capacitance of small dimensions into an integrated circuit.

With greater effect, as is described in the cited document, and once again considering FIG. 1 in its entirety, a high-frequency negative feedback is obtained by coupling the two oscillators 7, 8 with a synchronization cross-coupling. The oscillator 8 is provided by a ring oscillator formed by the delay cells 4, 5, 6 and identical to the oscillator 7, with which it has in common the MOS transistor 10 for the generation of the regulating voltage. The output cells 3, 6 of the two oscillators have their respective outputs connected to the inputs of a differential stage 9 which produces, at the output, a periodic signal VCOO. The output of the cell 3 is also connected, preferably, but not necessarily, via a resistor formed by a P-channel MOS transistor 15, to the input of the cell 6, and thus to the output of the cell 5. In analogous fashion, the output of the cell 6 is connected, preferably, but not necessarily, via a resistor formed by a P-channel MOS transistor 16, to the input of the cell 3, and thus to the output of the cell 2.

These connections introduce a positive feedback in the two rings, with gain less than 1 this forces the two rings to become synchronized with one another and causes a switching delay of the output cells. The delay is to a first approximation independent of the variations of voltage Vcc, which is in fact variable inversely with the voltage variations.

In addition, these connections effect, in the course of the synchronization interval, a resistive connection between voltage Vcc and voltage VR. This periodically increases the charging current of the regulating voltage generator and involves an increase in the mean value of the charging current and of the regulating voltage VR. Two effects are accordingly achieved: on the one hand, the fixed propagation delay of the cells 3 and 6 being indicated by $\Delta 1 > \Delta$, the period of oscillation of the two oscillators becomes P=2(2Δ+Δ1)>6Δ and only the period fraction corresponding to 4Δ is significantly influenced by the variations of the voltage Vcc, and, on the other hand, a voltage variation ΔVcc involves, over the period of oscillation, a variation of the regulating voltage VR in the opposite sense to ΔVcc, so that the noise rejection of Vcc is significantly improved.

Figure 3:
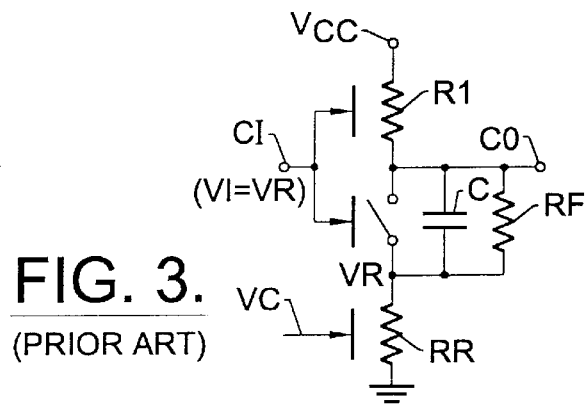
FIG. 3 represents the equivalent circuit diagram of a delay cell of the VCO of FIG. 1 with output coupled to the output of another delay cell, for a first operative condition according to the known prior art.

To explain this effect in qualitative terms, to a first approximation, reference may be made to FIG. 3. This represents the equivalent circuit diagram, for example, of the cell 2 of FIG. 1, when, at its input CI, the command signal, which is initially at electrical level Vcc, switches to the level VR, while the output of the cell 6 at electrical level VR is maintained at the same level and tends to bias the output node CO of the cell 2 to the same level (VR) via a negative-feedback resistance RF. The resistance RF represents the cumulative resistance of the MOS transistor 16 (FIG. 1) and of the MOS transistor 12 (FIG. 2) for connection of the output node of the cell 6 to the voltage VR. Under these conditions, the capacitor C, which is initially discharged, is connected to the voltage Vcc via a resistance R1 which represents the resistance of the P-channel MOS transistor of the cell 2, which transistor is brought to conduction. The capacitor then starts to be charged up, but the charging thereof is to some extent slowed down and limited in its maximum charging level by the negative-feedback resistance RF.

Figure 4:
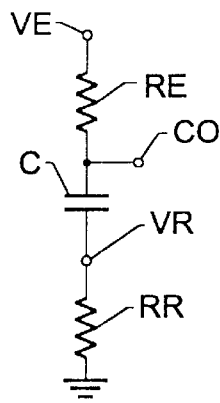
FIG. 4 represents a reduced equivalent circuit diagram of the circuit of FIG. 3 according to the known prior art.

The diagram of FIG. 3 may be reduced (involving the fundamental laws of electrical engineering) to the equivalent diagram of FIG. 4, that is to say to an RC network in which the equivalent resistance RE is equal to RE=R1·RF/(R1+RF) and the voltage applied to the network is VE=(Vcc−VR)RF/ (RF+R1)

If, as occurs, Rf=R1 or is slightly greater, the time constant of the RC network is virtually halved, but the maximum charging voltage of the capacitor is slightly greater than (Vcc−VR)/2. Thus, the output of the cell 2 reaches the switching level with a switching delay Al which is greater than the switching delay Δ of the other cells 1 and 3, the output of which is not connected to the feedback resistance RF.

It can be shown analytically that the delay Δ1 varies directly, although not in a strictly proportional fashion, with Vcc−VR. That is to say it increases with an increase in the supply voltage of the cells which is due either to an increase in Vcc or to a decrease in VR. Nevertheless, to a first approximation, Δ1 may be considered as constant. A rigorous computation should then take account of the fact that the resistance RF is not powered by a constant voltage VR but by a voltage which, as a result of the cross-coupling, tends to increase from VR to Vcc .

The same considerations may be applied in the opposite case, in which the capacitor C of the cell 2, which was initially charged and forced into a state of charging by the connection of the negative-feedback resistance to the voltage Vcc, is closed onto a discharging resistor (corresponding to the resistance of the MOS transistor 12 of FIG. 2, which is brought to conduction).

Figure 5:
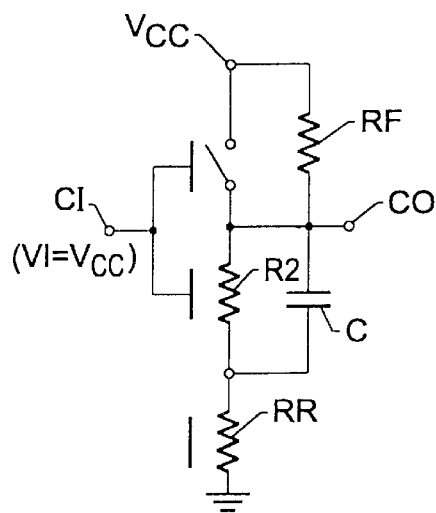
FIG. 5 represents the equivalent circuit diagram of a delay cell of the VCO of FIG. 1 with output coupled to the output of another delay cell, for a third operative condition according to the known prior art.

This situation of the cell 2 is represented by the equivalent circuit diagram of FIG. 5: the capacitor C, which is initially charged to the voltage Vcc−VR, is partially discharged until it assumes a charging voltage equal to (Vcc−VR).R2/(R2+RF) where R2<RF and the resistance of the N-channel MOS transistor 12 of FIG. 2 when brought to conduction. It is clear that the aforegoing considerations also apply to the cell 5.

It should also be noted that the current taken up by the circuit of FIG. 3 which flows to earth via the resistance RR of the generator of the regulating voltage VR is the sum of a pulsed charging current of the capacitor C and a current which flows from Vcc to VR, via the resistance RF, throughout the time when the resistance RF is connected to the voltage node VR. This time, which is imposed by the output switching of the cell 5 (which is partially synchronous with the switching power of the cell 2), may be considered as equal to Δ1.

This additional current is given by I=Vcc/(RR+RF+R1) and, ignoring second-order contributions (RF and Rl vary with Vcc and VR, while RR is independent of Vcc and VR), is a function of Vcc only. It is thus evident that a variation ΔVcc in Vcc causes a variation ΔI proportional to ΔVcc, during the interval Δ1 which, as it is less than ΔVcc and of limited duration Δ1 as compared with the period of the oscillator, contributes to a mean variation of the regulating voltage VR equal to ΔVRm=ΔVR·Δ1/P. This variation reduces to a significant extent the variation of the supply voltage Vcc−VR of the delay cells and the consequent variations of the frequency of oscillation of the rings, which consequent variations are caused by a variation of Vcc.

The same effect is found when the cell 2 (or the cell 5) is commanded by a voltage VI=Vcc while the negative feedback resistance is powered by the voltage Vcc. There is a flow of current from the source of voltage Vcc to earth, via the series of resistors RF, R2, RR which, disregarding second-order factors, is a function of Vcc only.

Figure 6:
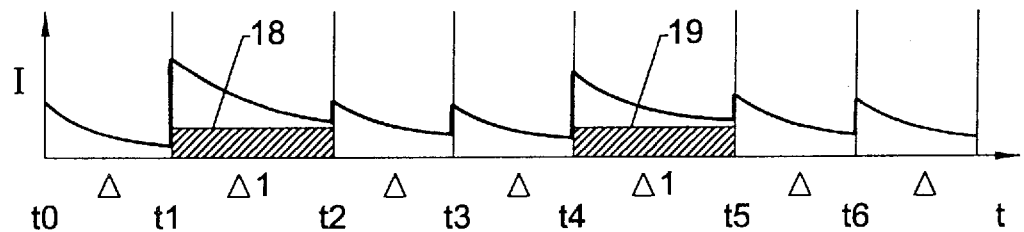
FIG. 6 represents, in a qualitative time diagram, the charging current of the regulating voltage generator of the VCO of FIG. 1 according to the known prior art.

Without entering into a detailed description of the operation of the VCO and of the interaction of the various cells, the time diagram of FIG. 6 represents the level of the current taken up by the VCO in the course of a period of oscillation, i.e. the load current of the regulating voltage generator. The period includes six time intervals, four of which t1–t0, t3–t2, t4–t3 and t6–t5 are of duration Δ equal to the propagation delay of the cells 1, 3, 4, 6 and two of which t2–t1 and t5–t4 are of duration Δ1>Δ equal to the propagation delay of the cells 2 and 5.

In the course of the intervals t1–t0, t3–t2, t4–t3, t6–t5, the current taken up is equal to the pulsed charging current of a capacitance of one of the various cells 1, 3, 4, 6 (the residual charging current of the other cells is negligible). In the course of the time intervals t2–t1 and t5–t4, the current taken up is equal to the pulsed charging current of the capacitance of one or the other of the cells 2, 5, respectively, plus an additive current 2ΔI which flows through the two feedback resistors RF, which respectively connect the output of the cell 3 to the output of the cell 5 and the output of the cell 6 to the output of the cell 2.

This additive current, which is represented by the hatched areas 18, 19 of FIG. 6 and the amplitude of which is, to a first approximation, with parameter RR constant, a function of Vcc only, provides a high frequency negative feedback, the effects of which are analyzed separately, as follows.

Assuming, for the sake of simplicity, that Al is independent of Vcc and VR, the period of oscillation is equal to P=4Δ+2Δ1 where A is a function of Vcc−VR. The duration 2Δ1 of the additional current relative to the period P constitutes a negative feedback to the ring oscillators, which improves the noise rejection but which, in this regard, reduces the gain in the open-ring transfer function equal to Ko (or KR).

In fact, a frequency variation ΔF=KoΔVc=1/ΔP no longer corresponds to a variation ΔVc and consequently ΔVR, for two reasons:

1) the variation of ΔP is due only to the variation of the propagation delay of only 4 out of 6 cells, and 2) with parity of amplitude of the additive current 2Δ1, the importance of the additive current with regard to the regulation voltage is a function of its duration in relation to the period of oscillation, i.e. it increases as the frequency increases.

The pure noise rejection with respect to the supply voltage, which has no effect on the gain of the transfer function of the oscillator rings, is due only to the variation in the amplitude of the additive current 2ΔI. It follows from the that this rejection, which is not obtainable separately from the aforegoing two effects, also involves a substantial reduction of the closed-loop gain and in practice demands that the gain of the open-loop transfer function of the oscillators is very high.

Figure 7:
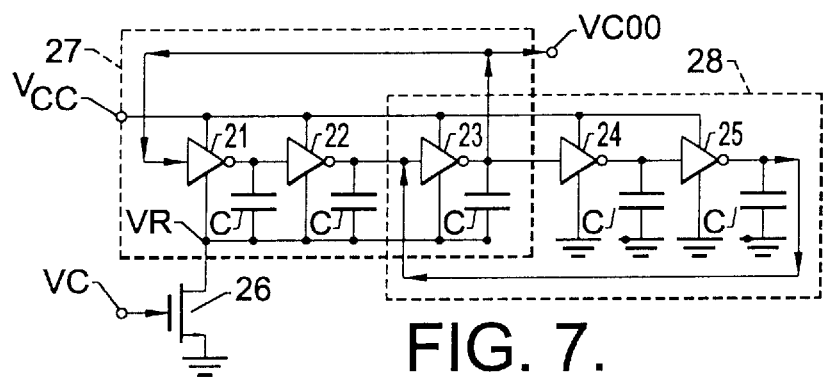
FIG. 7 represents, in block circuit diagram, a VCO constructed in accordance with the present invention, in its simplest embodiment.

After this lengthy introduction, it is possible to assess the advantages and the features of the voltage-controlled oscillator forming the subject of the present invention, which oscillator is represented in its simplest embodiment in FIG. 7. The VCO of FIG. 7 comprises a first ring oscillator 27, formed by three delay cells 21, 22, 23, which are ring-connected and are powered by a supply voltage VCC–VR. The regulating voltage VR is supplied by a regulating voltage generator 26 of variable resistance, for example, an N-channel MOS transistor.

This VCO further comprises a second ring oscillator 28, which may be defined as a negative-feedback oscillator, and which is formed by: at least one delay cell which is shared with the first oscillator, in this specific example, the cell 23, and by at least one pair of delay cells 24, 25 which are not shared with the first oscillator and which are powered at a fixed voltage Vcc and connected between voltage Vcc and earth. The output of the cell 25 is connected to the input of the cell 23, and thus to the output of the cell 22, possibly via a resistor. The capacitors C connected between output of the cells and voltage VR or earth respectively, represent the parasitic capacitances of each cell and of a possible additional capacitance, which is introduced into the cells in order to increase the propagation time thereof.

As the two oscillators have at least one cell in common, they are constrained to oscillate with the same period, interfering on a mutual basis if the cumulative propagation time of the delay cells of the two rings is different. In particular if, as occurs, the cells 24, 25 have a constant or relatively constant propagation delay, which is in fact influenced only by the variations ΔVcc and, anyway, to a far lesser extent than the delay of the other cells, the output signal from the cell 25 and the output signal from the cell 22, which switch at different instants, interfere on a mutual basis.

Figure 8:
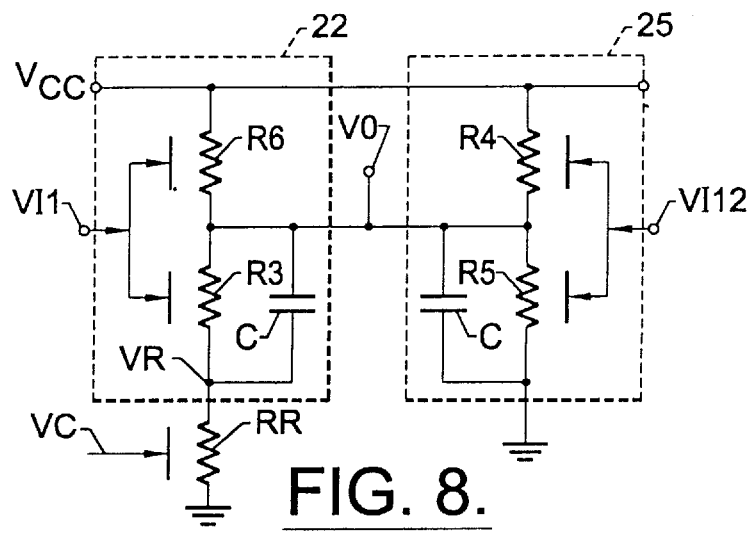
FIG. 8 represents a generalized equivalent circuit diagram of two cells of the VCO of FIG. 7 with mutually coupled outputs.

FIG. 8 represents the equivalent circuit diagram, obviously simplified, of the two cells 22 and 25, the outputs of which are electrically connected at a common output terminal VO which is connected to the input of the cell 23. The resistors R6, R3, R4, R5 represent the resistances of the MOS transistors of the two cells, which are variable as a function of the command voltage VI1 and VI2 which is applied, respectively, on the input side to the two delay cells. The variable resistance RR represents the resistance of the control MOS transistor 26 which imposes the supply voltage Vcc–VR on the cell 22.

It should be noted that, while VI1 varies essentially between Vcc and VR, the voltage VI2 varies between Vcc and a value which is even less than VR and close to earth. The switching of the signals VI1 and VI2 is not synchronous, but is dependent upon the differing propagation delay of the cell 24, which, for the sake of simplicity, may be considered constant, relative to the variable propagation delay of the cell 21, the cells 24 and 21 being commanded synchronously by the output of the cell 23. It is accordingly clear that, as a function of the command voltages VI1 and VI2, the network of FIG. 8 may assume four conditions, which are represented by the equivalent diagrams of FIGS. 9, 10, 11 and 12.

If VI1 and VI2 are at electrical level Vcc (FIG. 9), the resistors R6 and R4 exhibit virtually infinite resistance and, under static regime conditions, there flows through the series of resistors R3, R5 and to earth a current I which is variable as a function of the regulating voltage VR. This current, which increases as VR increases, reduces the load current of the resistance RF and constitutes a positive feedback which does not reduce the gain of the transfer function of the VCO, but, if anything, increases it.

If VI1 and VI2 are, respectively, at electrical level VR and 0 or close to earth (FIG. 10), the resistors R3 and R5 exhibit a virtually infinite resistance and, under regime conditions, with the capacitances C charged, no current flows to the voltage node VR or to earth.

If VI1 is at electrical level VR and VI2 is at electrical level Vcc or close to this (FIG. 11), the resistors R3 and R4 exhibit a virtually infinite resistance, while R3 and R5 exhibit a low resistance.

Thus, there flows through the series of resistors R6 and R5 to earth a current which maintains VO at an intermediate level between Vcc and earth and thus prevents or at least retards the switching to high level of the output of the cell 22. This current does not influence the voltage node VR and, in contrast to the case represented in FIG. 3, does not introduce any negative feedback at the node.

Finally, if VI1 is at electrical level Vcc and VI2 is at electrical level equal or very close to earth (FIG. 12), the resistors R6 and R5 exhibit a virtually infinite resistance, while R3 and R4 exhibit a low resistance. Thus, there flows through the series of resistors R3 and R4 to the voltage node VR a current which maintains VO at an intermediate level between Vcc and VR and thus prevents or at least retards the switching to low level of the output of the cell 22. As in the case represented in FIG. 3, this current involves a current negative feedback introduced at the voltage node VR, which, disregarding second-order factors, is a function of the voltage Vcc only.

Figure 13:
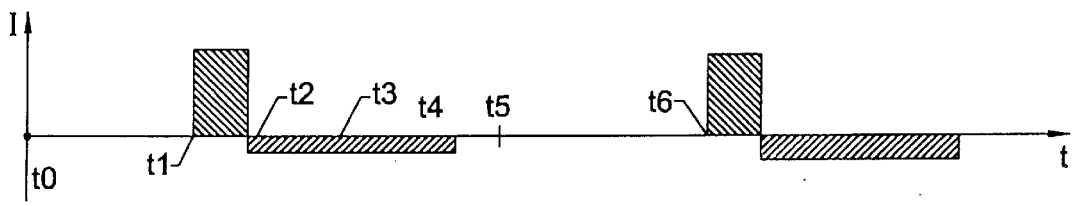
FIG. 13 represents, in a qualitative time diagram, the pulsed feedback current applied, as load, by the circuit of FIG. 8 to the regulation voltage generator of the VCO of FIG. 7.

In this case also, without entering into a detailed description of the operation of the VCO of FIG. 7 and of the interaction between the various cells, the timing diagram of FIG. 13 represents the progression only of the feedback current which is applied to the resistance RR of the regulating voltage generator, in the assumed case where the propagation delay of the cells 24, 25 Δ1 is greater than the propagation delay Δ of the other cells.

At the instant t1, the command signal VI1 applied to the input of the cell 22 switches from low level to high level, with a delay equal to 2Δ relative to the instant t0 at which the command signal VI switches from low level to high level at the input of the cell 23. At the instant t2, with a delay equal to 2Δ1 relative to the instant t0, that is to say with a delay with respect to ti, the input signal at the cell 25 also switches from low level to high level. In the time interval t2–t1, there is thus implemented the circuit condition represented in FIG. 12 and a pulse of negative-feedback current is applied to the resistor RR. The amplitude of the pulse is a function only of the voltage Vcc and its duration, which is variable as a function of VR, is determined by the difference between 2Δ1 and 2Δ.

In the subsequent interval t3–t2, with an intermediate propagation delay between Δ and Δ1, the common output of the cells 22 and 25 switches from high level to low level and the switching propagates with delay 2Δ to the input of the cell 22 (instant t4) and with a delay 2Δ1 to the input of the cell 5 (instant t5).

Figure 9:
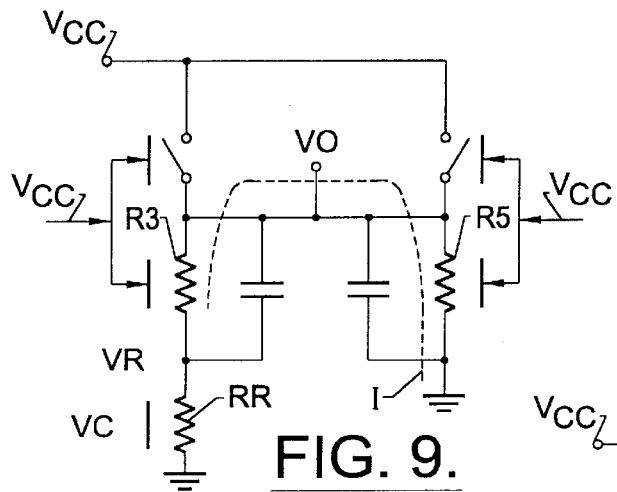
FIG. 9 represents the condition of the circuit diagram of FIG. 8 for a first operative condition.
Figure 10:
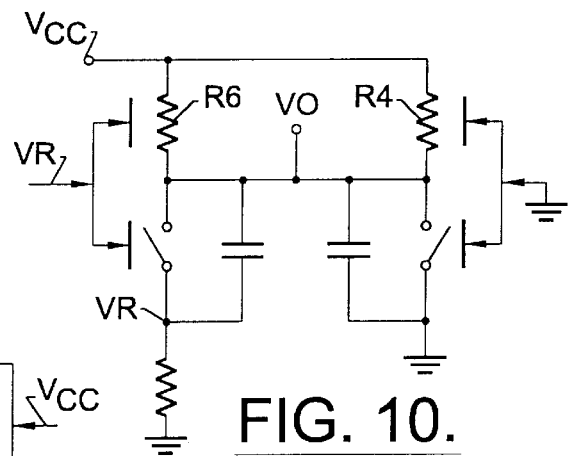
FIG. 10 represents the condition of the circuit diagram of FIG. 8 for a second operative condition.
Figure 11:
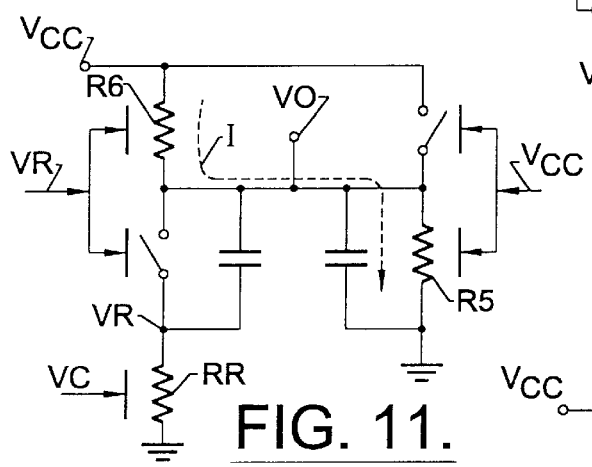
FIG. 11 represents the condition of the circuit diagram of FIG. 8 for a third operative condition.
Figure 12:
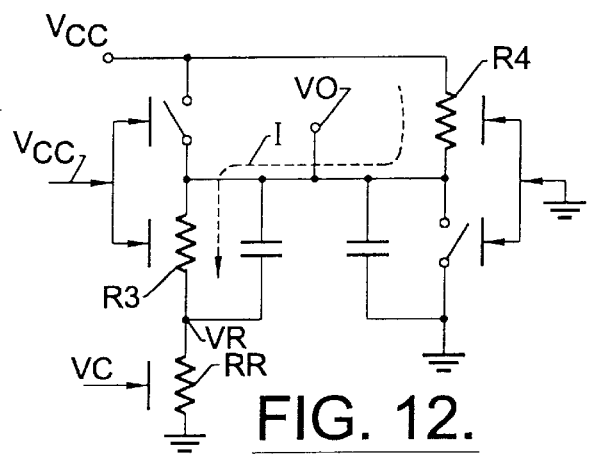
FIG. 12 represents the condition of the circuit diagram of FIG. 8 for a fourth operative condition.

In the time interval t4–t2 there is thus implemented the circuit condition represented in Fig. 9 and a pulse of positive-feedback current is applied to the resistor RR. Both the amplitude and the duration of the pulse are a function of VR. This positive feedback compensates to some extent the component of the negative feedback which was previously applied, which was due to the variability of VR, in such a way that the cumulative effect consists substantially in a pulsed high frequency negative feedback, with a period equal to the period of oscillation of the VCO, which is proportional to the variations of the supply voltage Vcc.

In the time interval which follows the instant t4 up to the subsequent switching to high level of the input signal at the cells 22 and 25 (instant t6), no feedback current flows through the resistor RR, and then the events which have been described are repeated with a period equal to t6–t1.

As may readily be verified, the same considerations are applicable in the case where the propagation delay Δ1 of the cells powered with constant voltage is less than the propagation delay of the cells powered with variable voltage Vcc–VR. The sole difference is that the pulse of negative-feedback current follows, instead of preceding, the pulse of positive feedback current. In each case, the voltage-controlled ring oscillator tends to adapt its period to that of the negative-feedback oscillator and the latter tends on a mutual basis to adapt its period to that of the former in such a manner that the two oscillate at the same frequency. This takes place without involving substantial variations of the gain Ko of the transfer function, but only by means of a suitable variation of the working point defined by the regulating voltage VR.

Figure 14:
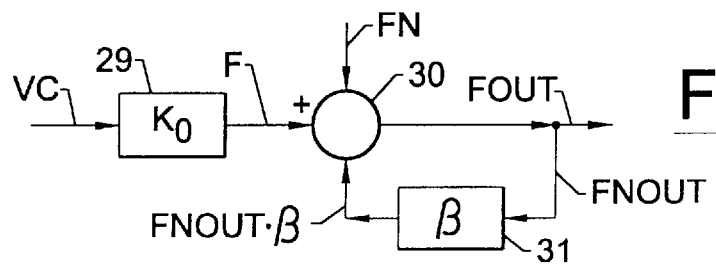
FIG. 14 represents, in a functional block diagram, the VCO of FIG. 7.

These concepts will become clearer from the block diagram of FIG. 14, which represents the VCO of FIG. 7 in terms of functional blocks. In FIG. 14, the block 29 represents the transfer function of the voltage-controlled ring oscillator. The transfer function of the block 29 is defined by a gain Ko, which is the ratio between an output frequency F and an input voltage Vc.

At the output of the block 29, there is an algebraic adder node 30 which adds to the output frequency F a noise frequency FN which is due to the variations of the supply voltage Vcc. The negative feedback oscillator comprises a negative feedback functional block 31 with high gain β (variable with the frequency of oscillation but of the order of one hundred) which receives on the input side only the noise component FNOUT of the output frequency FOUT and produces, at the output, a negative-feedback frequency FNOUT·β which is applied on the input side to the node 30 and is thus subtracted from the other input signals.

Thus, the output signal from the node 30, due to the negative feedback, is given by:
FOUT=F+FN.1/(1+β), that is to say the noise frequency is substantially reduced or rejected without influencing the gain Ko. This permits the construction of the voltage controlled oscillator with lower gain Ko, with parity of performance levels of the VCO, as compared with that adopted in the VCOs of the prior art, for example not exceeding 65 MHz/V, as against 100 MHz/V and above for the known prior art. The consequence of this is a further improvement of the noise rejection on the supply voltage.

Figure 15:
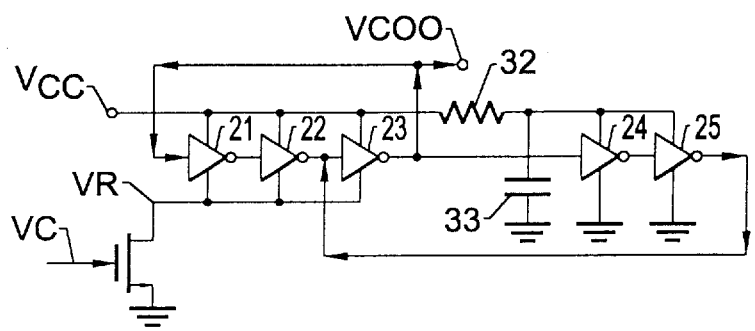
FIG. 15 represents, in a block circuit diagram, a variant of the VCO of FIG. 7.

A further advantage of a VCO constructed in accordance with the present invention is that the cells 24, 25 of the negative-feedback oscillator which are powered with constant voltage Vcc can be powered by an auxiliary voltage Vcc1 which is differentiated and not subject to noise. As is illustrated in FIG. 15, this may be readily obtained using a low pass filter with resistance 32 and capacitance 33, which filter is connected between Vcc and earth. Even though the cutoff frequency of this filter is very low, the response of the VCO to the variations of the command voltage Vc is not influenced, as would however be the case if the filter were connected upstream of the supply nodes of the cells 21, 22, 23 or, which would be worse, if it were connected between the input of the supply voltage Vcc and the oscillator node at voltage VR.

It should also be observed that in the circuit diagram of FIG. 7 and FIG. 15, it is not strictly essential that the cells 24 and 25 are both powered with constant voltage. It is sufficient for just the cell 24 to be powered with constant voltage and introduces within the period of oscillation of the negative-feedback ring a propagation delay independent of VR. The power which is required for powering with constant voltage the cells of the negative-feedback ring which are reduced to just one cell is thus reduced to a minimum and can readily be obtained using a voltage generator which is dedicated and free from noise.

Figure 16:
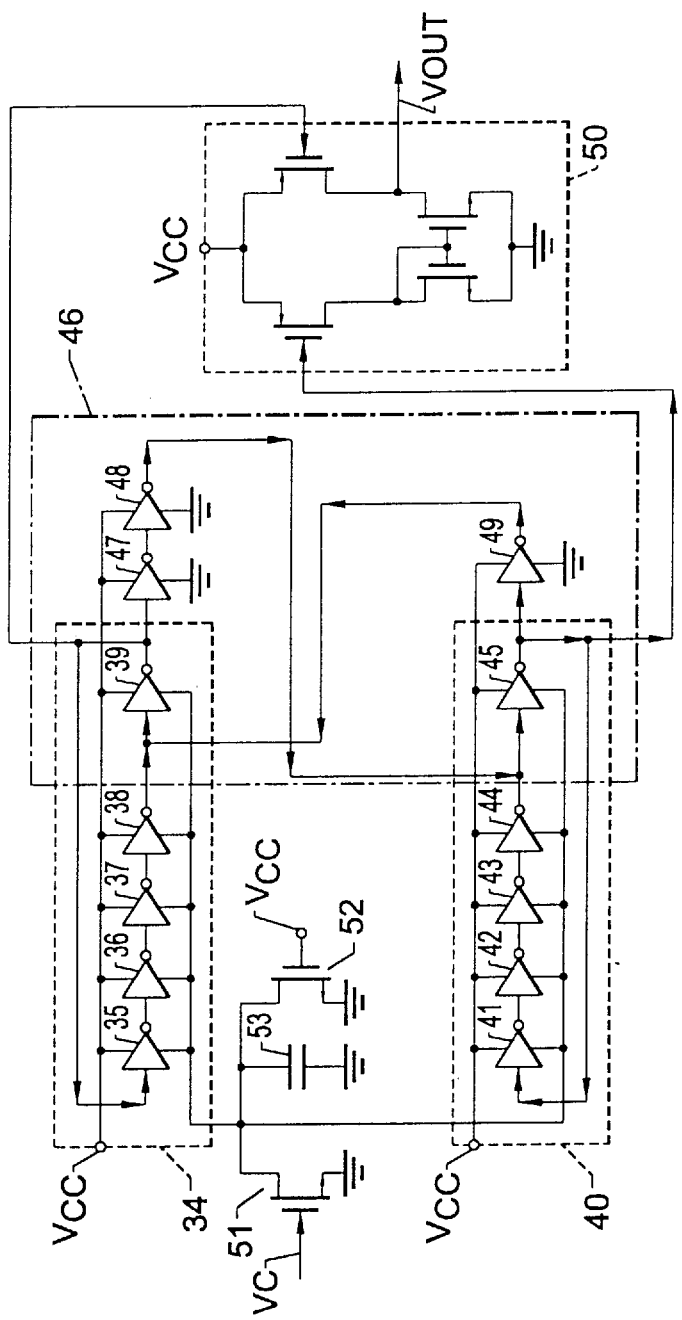
FIG. 16 represents, in a block circuit diagram, a preferred embodiment of the VCO in accordance with the present invention.

While the voltage-controlled oscillator of FIG. 7 represents the simplest embodiment of VCO in accordance with the present invention, a preferred embodiment is represented in FIG. 16. In FIG. 16, the VCO comprises a first voltage-controlled ring oscillator 34 which is formed by five delay cells 35, 36, 37, 38, 39, a second voltage-controlled ring oscillator 40, this also being formed by five delay cells 41, 42, 43, 44, 45 and a third synchronization and negative-feedback ring 46 which is preferably but not necessarily formed by five (this could also be an odd number>5) delay cells. One of the delay cells 39, is in common with the first ring, another of which, 45, is in common with the second ring, and the remaining three (or more) 47, 48, 49 are powered with constant voltage Vcc.

Preferably but not necessarily, for the reasons which we shall see, the cells 39, 45 are not directly chained in the synchronization ring, but are chained with the interposition of one or more of the other cells. Thus, in detail, the cell 39, which, as shown, may be the output cell of the ring 34, has its output connected to the input of the cell 47. The latter has its output connected to the input of the cell 48, which, in turn, has its output connected to the input of the cell 45.

The cell 45 has its output connected to the input of the cell 49, and the latter, in its turn, has its output connected to the input of the cell 39. The output of the cells 39 and 45 (or of any other cell of the first and second ring) is applied on the input side to a differential stage 50, which is conventional per se and not described in detail. At the output of the differential stage 50 there is available a periodic signal VOUT in asymmetric square wave form with full excursion of the signal from Vcc to zero.

An N-channel MOS transistor 51 controlled by the voltage Vc applied to the gate and having its source terminal connected to earth and its drain terminal connected to the virtual earth of the rings 34, 40, applies the regulating voltage VR to the rings. A second N-channel MOS transistor 52 with its gate connected to the supply voltage Vcc, source terminal connected to earth and its drain connected to the virtual earth of the two rings 34, 40, imposes on the virtual earth, in a known manner, a minimal voltage level, even in the case where the control voltage Vc is zero, which ensures a minimum frequency of oscillation of the two rings.

It is easy to verify that the synchronization ring 46 compels the first and the second ring to oscillate with the same frequency and a predetermined phase difference. The synchronization ring also oscillates with the same frequency. The frequency of oscillation is substantially that imposed by the control voltage Vc.

Furthermore, on the basis of what has been explained above with reference to FIG. 7, the coupling between synchronization ring and the two ring oscillators causes the flow of a pulsed negative-feedback current in the MOS transistor 51 which compensates for the possible variations of Vcc and thus rejects the noise of the supply voltage.

In contrast to the case represented in FIG. 7, in which there is only one pulse of negative-feedback current per period, the pulses of negative-feedback current are two per period and mutually spaced. There is thus a doubling of the frequency of the negative feedback pulses as compared with the frequency of oscillation and a reduction of the "ripple" of the regulating voltage VR. A further reduction of the ripple may be obtained by providing, in addition to the intrinsic parasitic capacitances of the MOS transistors 51, 52, an additional capacitance 53, of the order of a few pF, which is connected between earth and the voltage node VR.

Figure 17:
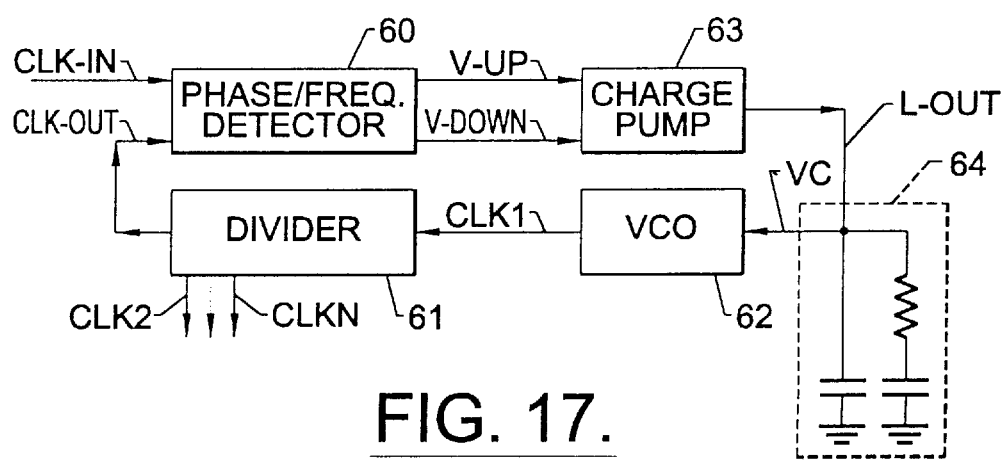
FIG. 17 represents, in a block circuit diagram, a phase-lock circuit incorporating a VCO constructed in accordance with the present invention.

FIG. 17 represents, in a block diagram, for completeness of description, an advantageous use of VCOs according to the present invention in a phase lock loop circuit (PLL). The phase lock loop circuit comprises a phase/frequency detector PFD 60, which is conventional per se and which compares a periodic reference signal CLK-IN with a signal CLK-OUT resulting, by frequency division in a divider 61, which is also conventional, from a periodic signal CLK1 at the output of the VCO 62.

The phase-frequency detector generates, at the output, two pulsed periodic signals V-UP, V-DOWN of constant amplitude and duration proportional to the phase difference, in the sense of a lead or delay respectively, of the signal CLK-OUT relative to CLK-IN.

The two signals are applied on the input side to a charge pump 63, which is conventional per se and which produces, at the output, a variable voltage LOUT as a function of the signals received at the input. This voltage, which is expediently filtered by a second-order filter 64, is applied on the input side to the VCO 62 as control voltage Vc.

It is clear that FIG. 16 represents only a preferred embodiment, and that many variants can be produced: by way of example, only one of the cells 47, 48, 49 or a subgroup of the cells 47, 48, 49 of the synchronization ring may be powered with constant voltage, rather than all the cells which are not common with the other oscillator rings. Furthermore, the number of delay cells of the three rings may be other than five, for example only three cells per ring, in which case the synchronization ring has one cell in common with the first ring, one cell in common with the second ring and just one cell, which does not belong to the first or second ring and which is powered with constant voltage.

We claim:

1. A voltage-controlled oscillator comprising:
   a plurality of delay cells in an odd number N≧3 connected to form a first ring oscillator and powered by a variable voltage obtained by a difference between a supply voltage and a regulating voltage supplied by a generator with variable resistance; and
   a second ring oscillator formed by a plurality of delay cells in an odd number M≧3, at least one of which is also a delay cell of said first ring oscillator and at least two of which are delay cells which do not belong to said first ring oscillator, at least one of said at least two delay cells being powered by a constant voltage.

2. A voltage-controlled oscillator according to claim 1, wherein the constant voltage is the supply voltage.

3. A voltage-controlled oscillator according to claim 1, wherein the constant voltage is a voltage other than the supply voltage.

4. A voltage-controlled oscillator according to claim 1, wherein said first ring oscillator has a transfer function gain of less than about 65 MHz/V.

5. A voltage-controlled oscillator according to claim 1, further comprising a third ring oscillator powered by the variable voltage, and wherein said third ring oscillator is identical to and distinct from said first ring oscillator and has at least one delay cell which is also a delay cell of said second ring oscillator.

6. A voltage-controlled oscillator according to claim 5, in which said first ring oscillator, said second ring oscillator and said third ring oscillator each comprise five delay cells, and wherein the delay cells of said second ring oscillator which are respectively common with said first and third ring oscillators are chained to one another in said second ring oscillator with interposition of at least one delay cell powered by the constant voltage.

7. A voltage-controlled oscillator comprising:
   a plurality of delay cells in an odd number N≧3 connected to form a first ring oscillator and powered by a variable voltage obtained by a difference between a supply voltage and a regulating voltage supplied by a generator with variable resistance, said first ring oscillator having a transfer function gain of less than about 65 MHz/V; and
   a second ring oscillator formed by a plurality of delay cells in an odd number M ≧3, at least one of which is also a delay cell of said first ring oscillator and at least two of which are delay cells which do not belong to said first ring oscillator, at least one of said at least two delay cells being powered by the supply voltage.

8. A voltage-controlled oscillator according to claim 7, further comprising a third ring oscillator powered by the variable voltage, and wherein said third ring oscillator is identical to and distinct from said first ring oscillator and has at least one delay cell which is also a delay cell of said second ring oscillator.

9. A voltage-controlled oscillator according to claim 8, in which said first ring oscillator, said second ring oscillator and said third ring oscillator each comprise five delay cells, and wherein the delay cells of said second ring oscillator which are respectively common with said first and third ring oscillators are chained to one another in said second ring oscillator with interposition of at least one delay cell powered by the supply voltage.

10. A voltage-controlled oscillator comprising:
    a plurality of delay cells in an odd number N≧3 connected to form a first ring oscillator and powered by a variable voltage obtained by a difference between a supply voltage and a regulating voltage supplied by a generator with variable resistance, said first oscillator having a transfer function gain of less than about 65 MHz/V; and
    a second ring oscillator formed by a plurality of delay cells in an odd number M≧3, at least one of which is also a delay cell of said first ring oscillator and at least two of which are delay cells which do not belong to said first ring oscillator, at least one of said at least two delay cells being powered by a constant voltage different from the supply voltage.

11. A voltage-controlled oscillator according to claim 10, further comprising a third ring oscillator powered by the variable voltage, and wherein said third ring oscillator is identical to and distinct from said first ring oscillator and has at least one delay cell which is also a delay cell of said second ring oscillator.

12. A voltage-controlled oscillator according to claim 11, in which said first ring oscillator, said second ring oscillator and said third ring oscillator each comprise five delay cells, and wherein the delay cells of said second ring oscillator which are respectively common with said first and third ring oscillators are chained to one another in said second ring oscillator with interposition of at least one delay cell powered by the constant voltage.

13. A phase lock circuit comprising
   means for generating a voltage signal of amplitude correlated with a phase difference between a first periodic signal and a second periodic reference signal;
   a frequency divider for extracting the first periodic signal from a third periodic signal having a frequency which is a multiple of that of the first periodic signal; and
   a voltage-controlled oscillator controlled by the voltage signal to generate said third periodic signal, said voltage-controlled oscillator comprising
      a plurality of delay cells in an odd number $N \geq 3$ connected to form a first ring oscillator and powered by a variable voltage obtained by a difference between a supply voltage and a regulating voltage supplied by a generator with variable resistance, and
      a second ring oscillator formed by a plurality of delay cells in an odd number $M \geq 3$, at least one of which is also a delay cell of said first ring oscillator and at least two of which are delay cells which do not belong to said first ring oscillator, at least one of said at least two delay cells being powered by a constant voltage.

14. A phase lock circuit according to claim 13, wherein the constant voltage is the supply voltage.

15. A phase lock circuit according to claim 13, wherein the constant voltage is a voltage other than the supply voltage.

16. A phase lock circuit according to claim 13, wherein said first ring oscillator has a transfer function gain of less than about 65 MHz/V.

17. A phase lock circuit according to claim 13, further comprising a third ring oscillator powered by the variable voltage, and wherein said third ring oscillator is identical to and distinct from said first ring oscillator and has at least one delay cell which is also a delay cell of said second ring oscillator.

18. A phase lock circuit according to claim 17, in which said first ring oscillator, said second ring oscillator and said third ring oscillator each comprise five delay cells, and wherein the delay cells of said second ring oscillator which are respectively common with said first and third ring oscillators are chained to one another in said second ring oscillator with interposition of at least one delay cell powered by the constant voltage.

* * * * *

UNITED STATES PATENT AND TRADEMARK OFFICE
CERTIFICATE OF CORRECTION

PATENT NO. : 5,864,258  Page 1 of 2
DATED : January 26, 1999
INVENTOR(S) : Paolo Cusinato, and Melchiorre Bruccoleri It is certified that error appears in the above-identified patent and that said Letters Patent is hereby corrected as shown below:

On the title page, [75] Inventors:   Strike:  "Genoa"

Insert:  -- Genova --

Column 1, Line 37   Strike:  "29N · $\Delta$"

Insert:  -- 2N · $\Delta$ --

Strike:  " A "

Insert:  -- $\Delta$ --

Column 7, Line 39   Strike:  " A1 "

Insert:  -- $\Delta 1$ --

UNITED STATES PATENT AND TRADEMARK OFFICE
CERTIFICATE OF CORRECTION

PATENT NO. : 5,864,258
DATED : January 26, 1999
INVENTOR(S) : Paolo Cusinato, and Melchiorre Bruccoleri It is certified that error appears in the above-identified patent and that said Letters Patent is hereby corrected as shown below:

| | | |
|---|---|---|
| Column 8, Line 55 | Strike: | " A1 " |
| | Insert: | -- $\Delta 1$ -- |
| Column 8, Line 57 | Strike: | " A " |
| | Insert: | -- $\Delta$ -- |

Signed and Sealed this

Sixth Day of July, 1999

Attest:

Q. TODD DICKINSON

*Attesting Officer*  *Acting Commissioner of Patents and Trademarks*